United States Patent
Warwar

(10) Patent No.: US 6,366,140 B1
(45) Date of Patent: Apr. 2, 2002

(54) HIGH BANDWIDTH CLOCK BUFFER

(75) Inventor: Greg Warwar, Santa Paula, CA (US)

(73) Assignee: Vitesse Semiconductor Corporation, Camarillo, CA (US)

( * ) Notice: Subject to any disclaimer, the term of this patent is extended or adjusted under 35 U.S.C. 154(b) by 0 days.

(21) Appl. No.: 09/345,885

(22) Filed: Jul. 1, 1999

(51) Int. Cl.[7] .............................. H03B 1/00; H03K 3/00
(52) U.S. Cl. .................. 327/108; 327/65; 327/563; 327/333; 330/253; 326/115; 326/126
(58) Field of Search .................. 327/108–112, 170, 327/52, 57, 563, 63–66, 54, 55, 67, 333; 330/253; 326/115, 126

(56) References Cited

U.S. PATENT DOCUMENTS

| | | | | |
|---|---|---|---|---|
| 4,276,485 A | * | 6/1981 | Rydval | 326/126 |
| 4,437,171 A | | 3/1984 | Hudson et al. | 365/38 |
| 4,739,198 A | * | 4/1988 | Maruyama | 327/108 |
| 4,754,171 A | * | 6/1988 | Dasai et al. | 326/126 |
| 4,999,520 A | | 3/1991 | Usami et al. | 307/456 |
| 5,376,898 A | * | 12/1994 | Tanaka et al. | 330/253 |
| 5,512,853 A | * | 4/1996 | Ueno et al. | 327/108 |
| 5,602,498 A | * | 2/1997 | Satoh et al. | 326/126 |
| 5,652,545 A | * | 7/1997 | Miyashita et al. | 330/253 |
| 5,754,062 A | * | 5/1998 | Satoh et al. | 326/126 |
| 5,796,278 A | * | 8/1998 | Osborn et al. | 327/108 |
| 5,818,278 A | | 10/1998 | Yamamoto et al. | 327/333 |
| 6,011,436 A | * | 1/2000 | Koike | 330/253 |

FOREIGN PATENT DOCUMENTS

JP    02 071612    3/1990

OTHER PUBLICATIONS

Sasaki, et al., "A New Emitter–Follower Circuit for High–Speed and Low–Power ECL," IEICE Trans. Electron. vol. E78–C No. 4, pp. 374–379, Apr. 1995.

* cited by examiner

Primary Examiner—Terry D. Cunningham
Assistant Examiner—Long Nguyen
(74) Attorney, Agent, or Firm—Christie, Parker & Hale, LLP

(57) ABSTRACT

A high bandwidth clock buffer, including a steering circuit, significantly increases the maximum frequency at which CMOS technology can be used to perform high-speed logic functions. In particular, the clock buffer includes a steering circuit for enhancing a voltage follower stage. The steering circuit includes steering transistors positioned between voltage follower transistors and constant current sources. The steering circuit switches all or substantially all of the current from both of the constant current sources through whichever of the two voltage follower transistors is being pulled low, thus doubling the amount of current that is available for slewing when the output is being pulled low. At the same time, since the voltage follower transistor that is being pulled high no longer has to source the constant current $I_0$, the effective maximum current that can be supplied to charge up the load capacitance is increased by approximately $I_0$. The clock buffer provides a higher unity gain bandwidth than a standard CML buffer, while maintaining a well controlled delay which will track other logic gates.

28 Claims, 1 Drawing Sheet

HIGH BANDWIDTH CLOCK BUFFER

BACKGROUND OF THE INVENTION

This invention relates generally to digital communications, and more specifically to clock buffers.

For many applications in integrated circuit (IC) design, the highest frequency operation for a digital logic design can generally be achieved by using a differential current steering logic family, such as bipolar emitter-coupled logic (ECL), GaAs source-coupled field-effect transistor logic (SCFL) or CMOS current mode logic (CML). While these topologies generally have inferior speed/power ratios compared to alternative logic families such as direct-coupled field-effect transistor logic (DCFL) or static CMOS, they generally operate at a two to four times higher maximum clock frequency.

For applications requiring use of these high-speed logic families, the maximum frequency of operation will eventually be limited by the ability to maintain adequate gain on the clock path through the circuit. This is due to the fact that the clock bandwidth requirement is generally twice that of data, and the clock signal will generally have to pass through several levels of buffering. Once the frequency of operation is increased beyond the unity gain bandwidth of the clock buffers, the clock signal will be attenuated through each stage of buffering, and the circuit will fail to function.

Conventional techniques for extending the bandwidth of integrated circuit clock buffers, however, suffer from various shortcomings. For example, in an approach commonly referred to as inductive peaking, an on-chip spiral inductor is added in series with a resistive load device of a differential amplifier. The inductor is sized so that at the specified operating frequency of the circuit, the reactance of the inductor partially cancels the reactance of the parasitic capacitance at the output of the differential pair. However, inductive peaking suffers from undesirable characteristics, including for example that it has a frequency dependent gain which may present a problem for low speed functionality. It also has a frequency dependent delay, particularly near the resonant frequency of the peaking. This can present a problem if the delay of the clock signal needs to be controlled with respect to other delays in the circuit. Also, the area of on-chip spiral inductors is generally quite large, on the order of a factor of ten times, as compared to the area of a typical logic gate. Finally, a circuit with inductive peaking is of limited use in buffering an arbitrary data signal with unknown frequency components.

Another conventional approach in CMOS technology utilizes multiple phases of a lower frequency clock signal. Multiple circuits can then be operated in parallel, each running off of a different phase of the clock. This type of circuit can be thought of as emulating a circuit with a virtual clock of frequency $f_v = f_c * M$, where $f_c$ is the frequency of the multiphase clock, and M is the number of phases that are used in parallel. This second approach suffers from mismatches between each of the phases of the low speed clock. The consequence is an equivalent jitter on the "virtual" high-speed clock. Additionally, even if the potential problem of the clock needing to run at a frequency above the unity gain bandwidth of the clock buffers can be eliminated, a lack of sufficient bandwidth will still cause increased deterministic jitter on high-speed data signals. From a signal integrity point of view, this technique is inferior to a design in which the circuits have enough bandwidth to run off a single clock signal.

What is needed therefore is an apparatus and method for providing a high bandwidth clock buffer, which can significantly increase the maximum frequency at which CMOS technology can be used to perform high-speed logic functions.

SUMMARY OF THE INVENTION

The present invention provides, in a first aspect, a buffer including a differential amplifier for generating first and second amplified output signals in response to first and second differential amplifier input signals, a voltage follower comprising first and second voltage follower transistors for generating first and second buffer output signals in response to the first and second amplified output signals from the differential amplifier, and a steering circuit for steering current from current sources through whichever of the first and second voltage follower transistors is being pulled low to increase the amount of current.

In another aspect, the present invention provides a method for buffering signals, including the steps of generating first and second amplified output signals using a differential amplifier in response to first and second differential amplifier input signals, generating first and second buffer output signals in response to the first and second amplified output signals from the differential amplifier using a voltage follower comprising first and second voltage follower transistors, and steering current from current sources through whichever of the first and second voltage follower transistors is being pulled low to increase the amount of current that is available.

These and other features and advantages of this invention will become further apparent from the detailed description and accompanying figures that follow. In the figures and description, numerals indicate the various features of the invention, like numerals referring to like features throughout both the drawing figures and the written description.

DETAILED DESCRIPTION

Figure 1:
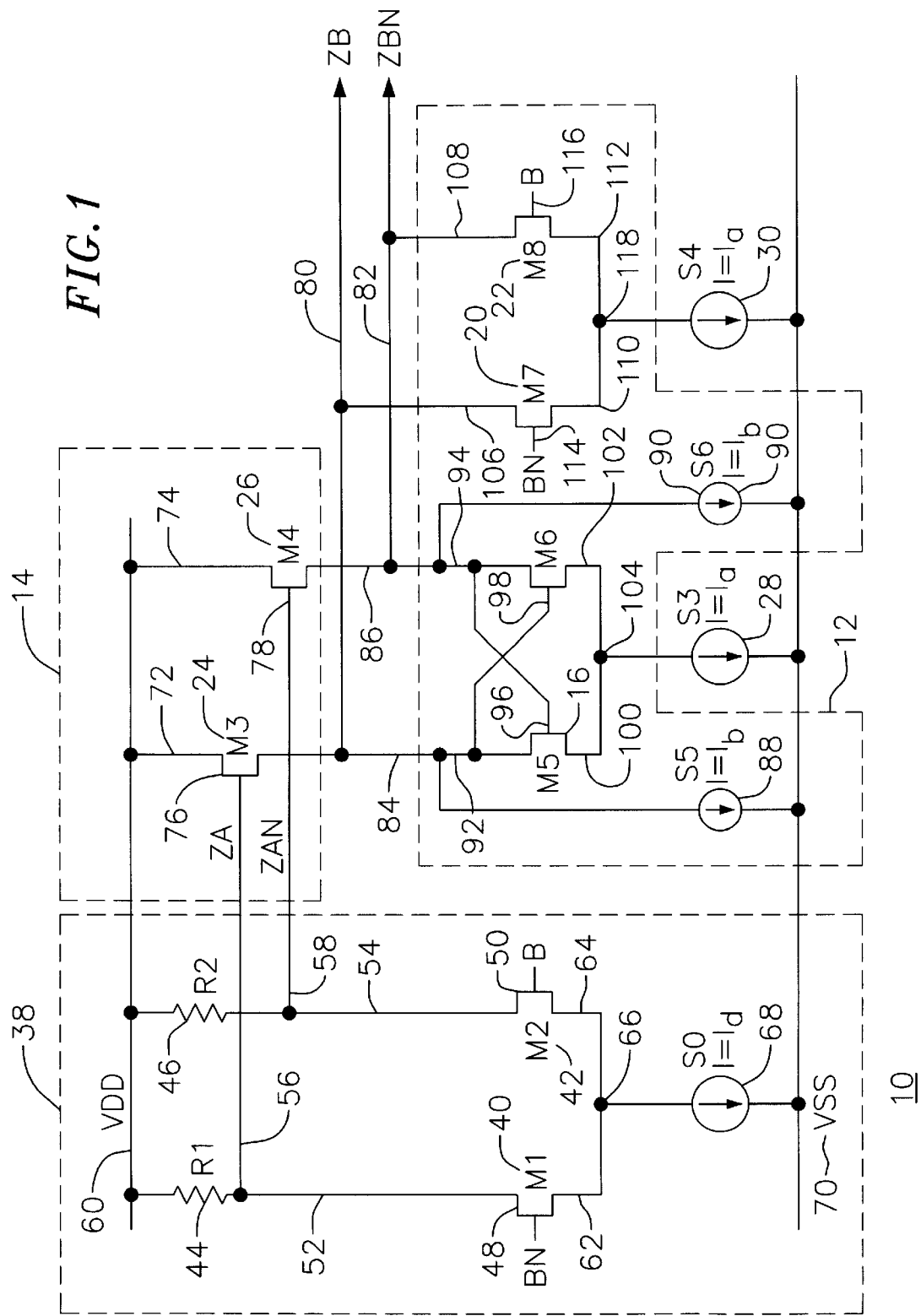
FIG. 1 is a block diagram of a high bandwidth CML buffer in accordance with the present invention.

Referring to FIG. 1, a high bandwidth clock buffer 10, including a steering circuit 12, significantly increases the maximum frequency at which CMOS technology can be used to perform high speed logic functions. As described in detail below, the clock buffer 10 provides a higher unity gain bandwidth than a standard CML buffer, while maintaining a well controlled delay which will track other logic gates. Use of the clock buffer 10 can extend the maximum frequency at which CMOS technology can be used without resorting to a multiphase clocking architecture, with its inherent drawbacks.

In particular, the clock buffer 10 includes the steering circuit 12 for enhancing a voltage follower stage 14 of the clock buffer 10. The steering circuit 12 includes switching transistors 16, 18, 20 and 22 positioned between voltage follower transistors 24 and 26 and current sources 28 and 30. The steering circuit 12 switches all or substantially all of currents from both sources 28 and 30 through whichever of the two voltage follower transistors 24 or 26 is being pulled low, thus approximately doubling an amount of current that is available for slewing when an output is being pulled low. At the same time, since the voltage follower transistor 24 or 26 that is being pulled high no longer has to source a constant current $I_0$ provided by sources 28 and 30, an effective maximum current that can be supplied to charge up a load capacitance is increased by $I_0$.

As illustrated in FIG. 1, an input signal B and its complementary input BN are coupled to a differential amplifier 38, which includes a pair of differential amplifier transistors 40 and 42 that in conjunction with load resistors 44 and 46 provide a voltage gain of input signals B and BN. In particular, the input signal B is coupled to a gate 50 of the differential amplifier transistor 42 and the complementary input signal BN is coupled to a gate 48 of the differential amplifier transistor 40. Drains 52 and 54 of the differential amplifier transistors 40 and 42 are coupled to differential amplifier output signals ZA 56 and ZAN 58, respectively. The drains 52 and 54 are also coupled to a VDD supply 60 via load resistors 44 and 46, respectively. The load resistor 44 is coupled to the differential amplifier transistor 40 and the voltage follower transistor 24. The load resistor 46 is coupled to differential amplifier transistor 42 and voltage follower transistor 26. Load resistors 44 and 46 are typically implemented as PMOS devices biased in the linear region. Source terminals 62 and 64 of the differential amplifier transistors 40 and 42 are coupled at a junction 66 so as to share a common current $I_d$ 68 coupled to a VSS supply 70.

The differential amplifier output signals ZA 56 and ZAN 58 drive the low output impedance voltage follower 14, which produces clock buffer output signals ZB 80 and ZBN 82. In a typical configuration, a substantial portion of the gain for the clock buffer 10 occurs in the differential amplifier stage 38.

In particular, the voltage follower 14 includes the voltage follower transistors 24 and 26, drains 72 and 74 of which are coupled to the VDD supply 60. Gates 76 and 78 of the voltage follower transistors 24 and 26 are coupled to the differential amplifier output signals ZA 56 and ZAN 58. The voltage follower stage 14 of the clock buffer 10 has no mechanism for gain, and thus has a gain which is at most unity. Due mainly to a body effect in CMOS, however, the gain is typically limited to approximately 0.9.

In operation, when the voltage follower transistor 24 is pulled high, it must temporarily source more current than $I_0$. This excess current, defined approximately by an equation $(I_{M3}-I_0)$, is responsible for charging a load capacitance of a clock buffer output signal ZB 80. A maximum slew rate when the output signal ZB 80 is being pulled high is degraded by $I_0$. Similarly, when the voltage follower transistor 24 is pulled low, it must temporarily source a current less than $I_0$, and this difference in current, defined approximately by an equation $(I_0-I_{M3})$, is used to discharge the load capacitance of the clock buffer output signal ZB 80. The maximum slew rate when the output signal ZB 80 is being pulled low is thus set by the constant current $I_0$. The voltage follower transister 26 operates in an identical manner to charge and discharge a load capacitance of a complementary clock buffer output signal ZBN 82.

In accordance with the present invention, the voltage follower 14 is enhanced by adding the steering circuit 12 between the voltage follower transistors 24 and 26 and the current sources 28 and 30. In particular, the steering circuit 12 includes steering transistors 16, 18, 20 and 22 positioned between the voltage follower transistors 24 and 26 and the current sources 28 and 30. Source terminals 84 and 86 of the voltage follower transistors 24 and 26 provide the clock buffer output signals ZB 80 and ZBN 82. The source terminals 84 and 86 are also coupled to the steering circuit 12, which includes the switching transistors 16, 18, 20 and 22.

In accordance with an advantage of the present invention, the steering transistors 16, 18, 20 and 22 switch all or approximately all of the current from both sources 28 and 30 through whichever of the two voltage follower transistors 24 or 26 is being pulled low, thus approximately doubling the amount of current that is available for slewing when the corresponding clock buffer output signal is being pulled low. At the same time, since the voltage follower transistor 24 or 26 that is being pulled high no longer has to source the constant current $I_0$, the effective maximum current that can be supplied to charge up the corresponding load capacitance is increased by $I_0$.

As illustrated in FIG. 1, a drain 92 of the switching transistor 16 is coupled to a gate 98 of the switching transistor 18, and a drain 94 of the switching transistor 18 is coupled to a gate 96 of the switching transistor 16. Current sources 88 and 90 are coupled to the drains 92 and 94 so that the voltage follower transistors 24 and 26 do not completely shut off when they are in a static logic high state. This prevents output nodes from going to a high impedance state in which an output voltage level would not be well controlled.

The additional current sources 88 and 90 need only be a fraction of a size of the main current sources 28 and 30 and are coupled to common VSS supply 70. Source terminals 100 and 102 of switching transistors 16 and 18 are coupled at junction 104 so as to share a common current coupled to the common VSS supply 70.

Drains 106 and 108 of the steering transistors 20 and 22 are coupled to the sources 84 and 86 of the voltage follower transistors 24 and 26 and the drains 92 and 94 of the steering transistors 16 and 18. The input signal B and the complementary input signal BN are coupled to the steering transistors 22 and 20 which provide a voltage gain of the input signals B and BN. The input signal B is coupled to a gate 116 of the steering transistor 22 and the complementary input signal BN is coupled to a gate 114 of the steering transistor 20. The drains 106 and 108 of the steering transistors 20 and 22 are coupled to the clock buffer outputs ZB 80 and ZBN 82. Sources 110 and 112 of the steering transistors 20 and 22 are coupled at a junction 118 so as to share a common current coupled to the VSS supply 70.

From a DC standpoint, a current steering accomplished by the steering transistors 16, 18, 20 and 22 could be controlled by either the input signals B and BN or the clock buffer output signals ZB 80 and ZBN 82, since both of these differential signals have the same or approximately the same DC values. To balance rise and fall times of the clock buffer output signals ZB 80 and ZBN 82, half of the current steering in the voltage follower stage 14 is controlled by the input signals B and BN, and the other half by the clock buffer output signals ZB 80 and ZBN 82. The rise time of the output signals is dominated by the amplified signals ZA 56 and ZAN 58 while the fall time is dominated by the switching transistors 16, 18, 20 and 22. Since the input signals B and BN are ahead of the amplified signals ZA 56 and ZAN 58 in time, and the clock buffer output signals ZB 80 and ZBN 82 are behind the amplified signals ZA 56 and ZAN 58 in time, the combination of both the input signals B and BN and the clock buffer output signals ZB 80 and ZBN 82 to control the current steering in the voltage follower stage 14, approximately balances the rise and fall times of the clock buffer output signals ZB 80 and ZBN 82.

In a typical operation, the clock buffer 10 possesses a gain greater than approximately 1.0 in the voltage follower stage 14. The transistors 40, 42, 24, 26, 16, 18, 20 and 22 are preferably FET transistors although one skilled in the art will recognize that the clock buffer 10 can be adapted such that other types of transistors may be used as well.

Having now described the invention in accordance with the requirements of the patent statutes, those skilled in this art will understand how to make changes and modifications in the present invention to meet their specific requirements or conditions. For example, one skilled in the art will recognize that the components identified above may be coupled directly or indirectly to each other. Such changes and modifications may be made without departing from the scope and spirit of the invention as set forth in the following claims.

What is claimed is:

1. A buffer, comprising:
    a differential amplifier receiving first and second buffer input signals and providing corresponding first and second amplified output signals, the first amplified output signal forming a complement of the first input signal, and the second amplified output forming a complement of the second input signal;
    a voltage follower comprising first and second voltage follower transistors, the first voltage follower transistor receiving the first amplified output signal and providing a first buffer output signal on a first buffer output signal line and the second voltage follower transistor receiving the second amplified output signal and providing a second buffer output signal on a second buffer output signal line; and
    a steering circuit and first and second current sources, the steering circuit switchably coupling the first current source to either the first buffer output signal line or the second buffer output signal line based on the state of the first and second buffer output signals, and the steering circuit switchably coupling the second current source to either the first buffer output signal line or the second buffer output signal line based on the state of the first and second buffer input signals;
    the second current source being coupled to the second buffer output signal line upon the second buffer input signal transitioning to high, and the second current source being coupled to the first buffer output signal line upon the first buffer input signal transitioning to high; and
    the first current source being coupled to the first buffer output signal line upon the second buffer output signal transitioning to high, and the first current source being coupled to the second buffer output signal line upon the first buffer output signal transitioning to high.

2. The buffer of claim 1, wherein the first current source is coupled to the second buffer output signal line in response to an assertion of a high signal on the first input signal and the second current source is coupled to the second buffer output signal line in response to an assertion of a high signal on the first buffer output signal line.

3. The buffer of claim 1, wherein approximately a first half of the current steering in the voltage follower is controlled by the first and second input signals and approximately a second half is controlled by the first and second buffer output signals.

4. The buffer of claim 3, wherein a rise time of the first and second buffer output signals is dominated by the first and second amplified output signals.

5. The buffer claimed in claim 4, wherein a fall time of the first and second buffer output signals is dominated by the steering circuit.

6. The buffer of claim 2, wherein the steering circuit comprises first and second steering transistors positioned between the first current source and the first voltage follower transistor, and third and fourth steering transistors positioned between the second voltage follower transistor and the second current source.

7. The buffer of claim 6, wherein the source terminals of the first and second voltage follower transistors provide the first and second buffer output signals.

8. The buffer of claim 7, wherein source terminals of the first and second voltage follower transistors are coupled to the steering circuit.

9. The buffer of claim 8, wherein the first and second voltage follower transistors and the first, second, third and fourth steering transistors are FET transistors.

10. A buffer comprising:
    a differential amplifier generating first and second amplified output signals in response to first and second differential amplifier input signals;
    a voltage follower comprising first and second voltage follower transistors generating first and second buffer output signals in response to the first and second amplified output signals from the differential amplifier; and
    a steering circuit coupled to current sources, each current source providing a current, the steering circuit steering the currents through whichever of the first and second voltage follower transistors is being pulled low to increase an amount of current that is available;
    wherein both the first and second differential amplifier input signals and the first and second buffer output signals control current steering in the voltage follower;
    wherein the voltage follower is enhanced by the steering circuit disposed between the first and second voltage follower transistors and the current sources, the steering circuit comprising first, second, third and fourth steering transistors located between the first and second voltage follower transistors and the current sources;
    wherein the current sources comprise first and second current sources; and
    wherein a drain of the first steering transistor is coupled to a gate of the second steering transistor and a drain of the second steering transistor is coupled to a gate of the first steering transistor.

11. The buffer of claim 10, wherein an additional current source is coupled to each of the drains of the first and second steering transistors to prevent the first and second voltage follower transistors from shutting off in a static logic high state.

12. The buffer of claim 11, wherein the first, second and additional current sources are coupled to a common voltage supply.

13. The buffer of claim 12, wherein source terminals of the first and second steering transistors share a common current coupled to the common voltage supply.

14. The buffer of claim 13, wherein the common current is supplied by the first current source.

15. The buffer of claim 14, wherein drains of the third and fourth steering transistors are coupled to sources of the first and second voltage follower transistors and to the drains of the first and second steering transistors.

16. The buffer of claim 15, wherein the first and second differential amplifier input signals are coupled to gates of the third and fourth steering transistors.

17. A method for buffering differential signals using a differential amplifier with outputs coupled to a voltage follower, the differential amplifier receiving a differential input signal and the voltage follower providing differential outputs, comprising:

receiving a differential input signal comprised of a first input signal and a second input signal;

generating first and second output signals in response to the first input signal and second input signal using a voltage follower comprising first and second voltage follower transistors; and steering current from a first current source through whichever of the first and second voltage follower transistors is being pulled low in response to whichever of the first and second output signals is being set to an output signal preidentified state, the first current source being coupled to the second output signal line upon the transitioning of the first output signal line to high, and the first current source being coupled to the first output signal line upon the transitioning of the second output signal line to high, and steering current from a second current source through whichever of the first and second voltage follower transistors is being pulled low in response to whichever of the first input signal and second input signal is being set to an input signal preidentified state, the second current source being coupled to the first output signal line upon the transitioning of the first input signal line to high and being coupled to the second output signal line upon the transitioning of the second input signal line to high.

18. The method of claim 17, wherein approximately a first half of the current steering in the voltage follower is accomplished using the first current source and approximately a second half of the current steering is accomplished using the second current source.

19. The method of claim 17, further comprising:

using source terminals of the first and second voltage follower transistors to provide the first and second output signals.

20. A method for buffering signals comprising:

generating first and second amplified output signals using a differential amplifier in response to first and second differential amplifier input signals;

generating first and second buffer output signals in response to the first and second amplified output signals from the differential amplifier using a voltage follower comprising first and second voltage follower transistors; and steering current using a steering circuit through whichever of the first and second voltage follower transistors is being pulled low to increase amount of current that is available, the current being provided by current sources;

controlling current steering in the voltage follower using both the first and second differential amplifier input signals and the first and second buffer output signals;

wherein the steering circuit is positioned between the first and second voltage follower transistors and the current sources;

wherein the steering circuit comprises first, second, third and fourth steering transistors located between the first and second voltage follower transistors and the current sources;

wherein the current sources comprise first and second current sources; and wherein a drain of the first steering transistor is connected to a gate of the second steering transistor and a drain of the second steering transistor is connected to a gate of the first steering transistor.

21. The method of claim 20, further comprising:

connecting an additional current source to each of the drains of the first and second steering transistors to prevent the first and second voltage follower transistors from shutting off in a static logic high state.

22. The method of claim 21, further comprising:

coupling the first, second and additional current sources to a common voltage supply.

23. The method of claim 22, wherein source terminals of the first and second steering transistors share a common current coupled to the common voltage supply.

24. The method of claim 23, wherein the common current is supplied by the first current source.

25. The method of claim 24, further comprising:

coupling drains of the third and fourth steering transistors to sources of the first and second voltage follower transistors and to the drains of the first and second steering transistors.

26. The method of claim 25, further comprising:

coupling the first and second differential amplifier input signals to gates of the third and fourth steering transistors.

27. The method of claim 20, wherein source terminals of the first and second voltage follower transistors are coupled to the steering circuit.

28. The method of claim 20, wherein the first and second voltage follower transistors and the first, second, third and fourth steering transistors are FET transistors.

* * * * *